United States Patent
Gong et al.

(10) Patent No.: US 11,990,538 B2
(45) Date of Patent: May 21, 2024

(54) IGBT DEVICE

(71) Applicant: SUZHOU ORIENTAL SEMICONDUCTOR CO., LTD., Jiangsu (CN)

(72) Inventors: Yi Gong, Jiangsu (CN); Rui Wang, Jiangsu (CN); Wei Liu, Jiangsu (CN); Yuanlin Yuan, Jiangsu (CN); Xin Wang, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 116 days.

(21) Appl. No.: 17/428,133

(22) PCT Filed: Nov. 27, 2019

(86) PCT No.: PCT/CN2019/121349
§ 371 (c)(1),
(2) Date: Aug. 3, 2021

(87) PCT Pub. No.: WO2021/102756
PCT Pub. Date: Jun. 3, 2021

(65) Prior Publication Data
US 2022/0285536 A1    Sep. 8, 2022

(51) Int. Cl.
*H01L 29/739* (2006.01)
*H01L 29/423* (2006.01)

(52) U.S. Cl.
CPC .... *H01L 29/7397* (2013.01); *H01L 29/42324* (2013.01)

(58) Field of Classification Search
CPC .............................. H01L 27/07; H01L 29/778
See application file for complete search history.

(56) References Cited

U.S. PATENT DOCUMENTS

| | | | |
|---|---|---|---|
| 2014/0299914 A1 | 10/2014 | Yilmaz et al. | |
| 2015/0325663 A1* | 11/2015 | Wang | H01L 29/1037 438/266 |
| 2017/0179115 A1* | 6/2017 | Wang | H01L 29/7786 |

FOREIGN PATENT DOCUMENTS

| JP | 2006344779 | 12/2006 |
|---|---|---|
| JP | 5366521 | 12/2013 |

OTHER PUBLICATIONS

PCT/CN2019/121349 International Search Report dated Aug. 28, 2020.

* cited by examiner

*Primary Examiner* — Christine A Enad
(74) *Attorney, Agent, or Firm* — Michael Best & Friedrich LLP

(57) ABSTRACT

Provided is an insulated gate bipolar transistor (IGBT) device. The IGBT device includes p-type body regions located on a top of an n-type drift region, a first n-type emitter region located within the p-type body region; a first gate structure located over the p-type body region, where the first gate structure includes a first gate dielectric layer, a first gate and an n-type floating gate which are located above the first gate dielectric layer, where the n-type floating gate is located on a side close to the n-type drift region in a lateral direction; an insulating dielectric layer located between the n-type floating gate and the first gate; and one opening in the first gate dielectric layer. The n-type floating gate is in contact with the p-type body region to form a p-n junction diode through the one opening.

7 Claims, 3 Drawing Sheets

IGBT DEVICE

TECHNICAL FIELD

The present application belongs to a technical field of insulated gate bipolar transistor (IGBT) devices and, for example, to an IGBT device with a fast reverse recovery speed and a small-size chip.

BACKGROUND

An insulated gate bipolar transistor (IGBT) device is a device composed of a MOS transistor and a bipolar transistor, and an input of the IGBT device is the MOS transistor and an output of the IGBT device is a PNP transistor. The turn-on and turn-off of the IGBT device are controlled by a gate-emitter voltage. When the gate-emitter voltage is greater than a threshold voltage Vth of the MOS transistor, a current channel is formed inside the MOS transistor and a base current is supplied to the bipolar transistor so that the IGBT device is turned on. When the gate-emitter voltage is smaller than the threshold voltage Vth of the MOS transistor, the current channel inside the MOS transistor will be turned off and the base current of the bipolar transistor will be turned off so that the IGBT device is turned off. If the IGBT device is turned off, when a collector-emitter voltage is less than 0 V, a body diode parasitic in the IGBT device is in a positive bias state, and a reverse current flows from an emitter electrode to a collector electrode through the body diode. In this case, the current in the body diode injects minority carriers, and these minority carriers perform reverse recovery when the IGBT device turns on again, causing a relatively large reverse recovery current and long reverse recovery time.

SUMMARY

The present application provides an IGBT device with a fast reverse recovery speed and a small-size chip, so as to solve the technical problem of long reverse recovery time caused by the minority carriers injection problem of an IGBT device in the related art.

The present application provides an IGBT device. The IGBT device includes: an n-type collector region and a p-type collector region, an n-type drift region located above the n-type collector region and the p-type collector region, multiple p-type body regions located above the n-type drift region, and at least one first MOSFET cell and at least one second MOSFET cell.

The at least one first MOSFET cell includes a first n-type emitter region located within the p-type body region; a first gate structure located over the p-type body region, where the first gate structure includes a first gate dielectric layer, a first gate and an n-type floating gate which are located above the first gate dielectric layer, where the n-type floating gate is located on a side close to the n-type drift region in a lateral direction and the first gate is located on a side close to the first n-type emitter region and extends over the n-type floating gate, an insulating dielectric layer located between the n-type floating gate and the first gate; and one opening in the first gate dielectric layer, where the n-type floating gate is in contact with the p-type body region to form a p-n junction diode through the one opening.

The at least one second MOSFET cell includes a second n-type emitter region located within the p-type body region, a second gate structure for controlling a current channel between the second n-type emitter region and the n-type drift region to turn on and turn off, where the second gate structure includes a second gate dielectric layer and a second gate.

In an implementation, the IGBT device of the present application further includes an n-type field cut-off region located above the n-type collector region and the p-type collector region, where the n-type field cut-off region is located below the n-type drift region.

In an implementation, in the IGBT device of the present application, the at least one second MOSFET cell further includes a gate trench recessed in the n-type drift region, and the second gate dielectric layer and the second gate are located within the gate trench.

In an implementation, in the IGBT device of the present application, the first n-type emitter region and the second n-type emitter region are located within a same p-type body region.

In an implementation, in the IGBT device of the present application, the first n-type emitter region and the second n-type emitter region are located within two different ones of the multiple p-type body regions.

In an implementation, in the IGBT device of the present application, the first gate covers a side wall of the n-type floating gate close to the n-type drift region.

In an implementation, in the IGBT device of the present application, in a case where the IGBT device includes multiple second MOSFET cells, the second gate of at least one of the multiple second MOSFET cells is electrically connected to the second n-type emitter region.

In the IGBT device provided by the present application, when the first MOSFET cell is reverse-conducting, the first MOSFET cell has a low threshold voltage, so that the first MOSFET cell is turned on at a low gate voltage (or a voltage of 0 V), thus the reverse current flowing through the first MOSFET cell can be increased, thereby further reducing the current flowing through the body diode parasitic in the IGBT device, and improving the reverse recovery speed of the IGBT device. The second MOSFET cell has a shorter current channel than the first MOSFET cell. The current channel is used for controlling the size of the chip of the IGBT device so that the IGBT device has a smaller chip size while having a fast reverse recovery speed.

BRIEF DESCRIPTION OF DRAWINGS

To illustrate the solutions in the exemplary embodiments of the present application more clearly, the drawings used in the embodiments will be described below.

DETAILED DESCRIPTION

Figure 1:
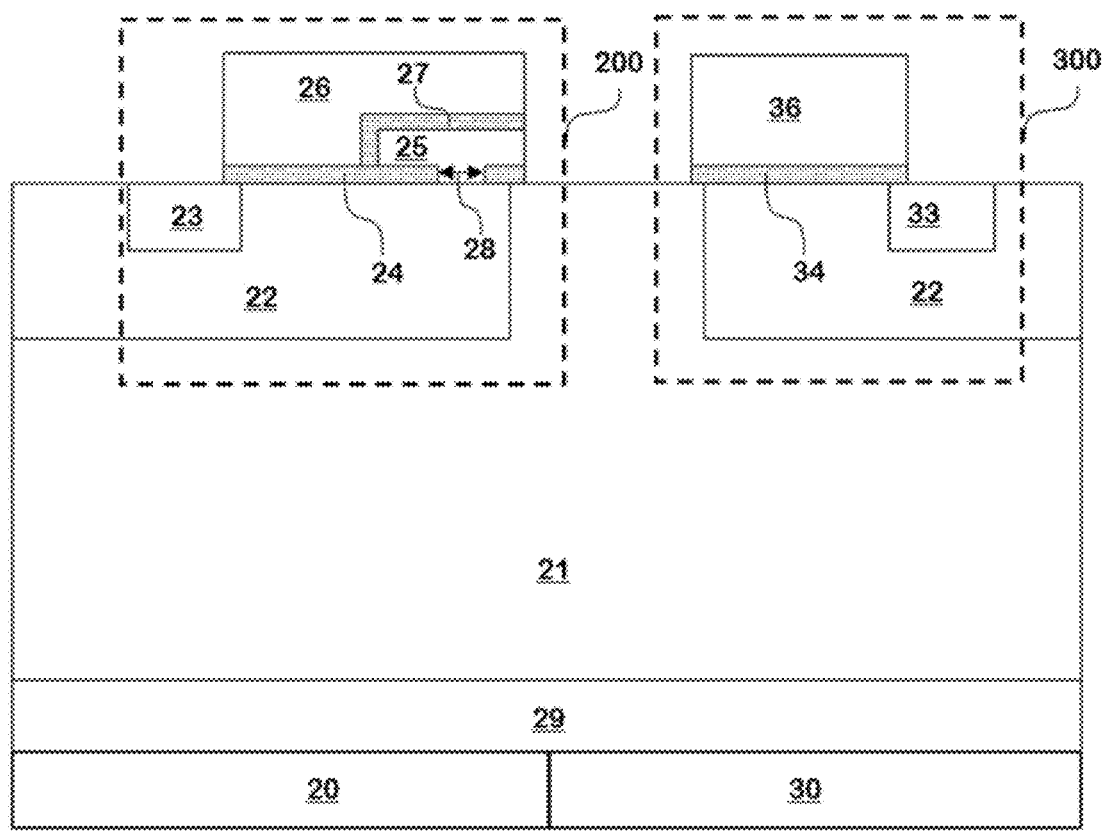
FIG. 1 is a sectional view of an IGBT device in a first embodiment provided by the present application.

The solution of the present application is described hereinafter through specific implementations in conjunction with the drawings in embodiments of the present application. Meanwhile, to illustrate the embodiments of the present application more clearly, in the schematic diagrams illustrated in the drawings of the Description, the sizes of layers and regions described in the present application are enlarged, and the sizes illustrated in the drawings do not represent the actual sizes. The embodiments described in the Description are not intended to limit the regions shown in the drawings to specific shapes, but include obtained shapes, for example, deviations due to manufacturing.

FIG. 1 is a sectional view of an IGBT device in a first embodiment provided by the present application. As shown in FIG. 1, an embodiment of the present disclosure provides an IGBT device. The device includes an n-type collector region 20 and a p-type collector region 30, an n-type field cut-off region 29 located above the n-type collector region 20 and the p-type collector region 30, an n-type drift region 21 located above the n-type field cut-off region 29, multiple p-type body regions 22 located above the n-type drift region 21. Only two p-type body regions 22 are shown exemplarily in the embodiment of the present application. The IGBT device in the embodiment of the present application further includes at least one first MOSFET cell 200 and at least one second MOSFET cell 300, only one first MOSFET cell 200 and one second MOSFET cell 300 are shown exemplarily in FIG. 1.

The at least one first MOSFET cell 200 includes a first n-type emitter region 23 located within the p-type body region 22; a first gate structure located over the p-type body region 22. The first gate structure includes a first gate dielectric layer 24, a first gate 26 and an n-type floating gate 25 which are located above the first gate dielectric layer 24, where the n-type floating gate 25 is located on a side close to the n-type drift region 21 in a lateral direction and the first gate 26 is located on a side close to the first n-type emitter region 23 and extends over the n-type floating gate 25, and an insulating dielectric layer 27 located between the n-type floating gate 25 and the first gate 26, the first gate 26 acts on the n-type floating gate 25 by capacity coupling. The insulating dielectric layer 27 is generally silicon dioxide. An opening 28 is formed in the first gate dielectric layer 24 under the n-type floating gate 25, the n-type floating gate 25 is in contact with the p-type body region 22 to form a p-n junction diode through the one opening 28.

The at least one second MOSFET cell 300 in the embodiment of the present disclosure includes a second n-type emitter region 33 located within the p-type body region 22, in the IGBT device in the embodiment of the present application shown in FIG. 1, the first n-type emitter region 23 of the first MOSFET cell 200 and the second n-type emitter region 33 of the second MOSFET cell 300 are located within two different ones of the multiple p-type body regions 22. The second MOSFET cell 300 also includes a second gate dielectric layer 34 located over the p-type body region 22 and a second gate 36 located over the second gate dielectric layer 34. The second gate 36 may control a current channel (i.e., a current channel between the second n-type emitter region 33 and the n-type drift region 21) of the second MOSFET cell 300 to turn on and turn off through a gate voltage.

The IGBT device of the embodiment of the present disclosure includes multiple second MOSFET cells 300, so that the second gate 36 of at least one of the multiple second MOSFET cells 300 is electrically connected to the second n-type emitter region 33, that is, this part of the second gate 36 are connected to a source voltage, which can reduce gate charges of the IGBT device.

In the IGBT device of the embodiment of the present application, in a forward blocking state, a high voltage is applied to the n-type collector region 20 and the p-type collector region, the p-n junction diode in the first MOSFET cell 200 is forward biased, and the n-type floating gate 25 is charged with positive charges, which causes a threshold voltage Vht1 of the current channel under the n-type floating gate 25 to decrease.

In the embodiment of the present disclosure, in a case where the IGBT device is in a forward blocking state and a forward turn-on state, a collector-emitter voltage is greater than 0 V, the threshold voltage Vht1 of the current channel under the n-type floating gate 25 has little influence on a threshold voltage Vth of the entire first MOSFET cell 200, and the first MOSFET cell 200 still has a high threshold voltage Vth. In this embodiment of the present disclosure, in a case where the IGBT device is turned off, when an emitter-collector voltage is greater than 0 V, the threshold voltage Vht1 of the current channel under the n-type floating gate 25 has a great influence on the threshold voltage Vth of the entire first MOSFET cell 200, so that the first MOSFET cell 200 has a low threshold voltage Vth, thus the current channel of first the MOSFET cell 200 is turned on at a low gate voltage (or a voltage of 0 V), thereby increasing the reverse current flowing through the first MOSFET cell 200, reducing the current flowing through a body diode parasitic in the IGBT device, and improving the reverse recovery speed of the IGBT device.

The first MOSFET unit 200 in the IGBT device in the embodiment of the present application is used for adjusting the reverse recovery speed of the IGBT device. However, due to the lateral arrangement of the first gate 26 and the n-type floating gate 25, and the size limitation of the opening 28 in the first gate dielectric layer 24, the first MOSFET cell 200 has a very long current channel, which increases the size of a chip of the IGBT device and is not conducive to encapsulating a smaller size of the IGBT device. In the embodiment of the present disclosure, through configuring the second MOSFET unit 300 and the second MOSFET unit 300 not being provided with the n-type floating gate structure, so that the second MOSFET unit 300 has a shorter current channel than the first MOSFET unit 200. Therefore, through configuring a ratio of the first MOSFET unit 200 to the second MOSFET unit 300, the size of the chip the IGBT device can be effectively controlled while ensuring that the IGBT device has a fast reverse recovery speed, so that the chip of the IGBT device can be packaged in a smaller size.

Figure 2:
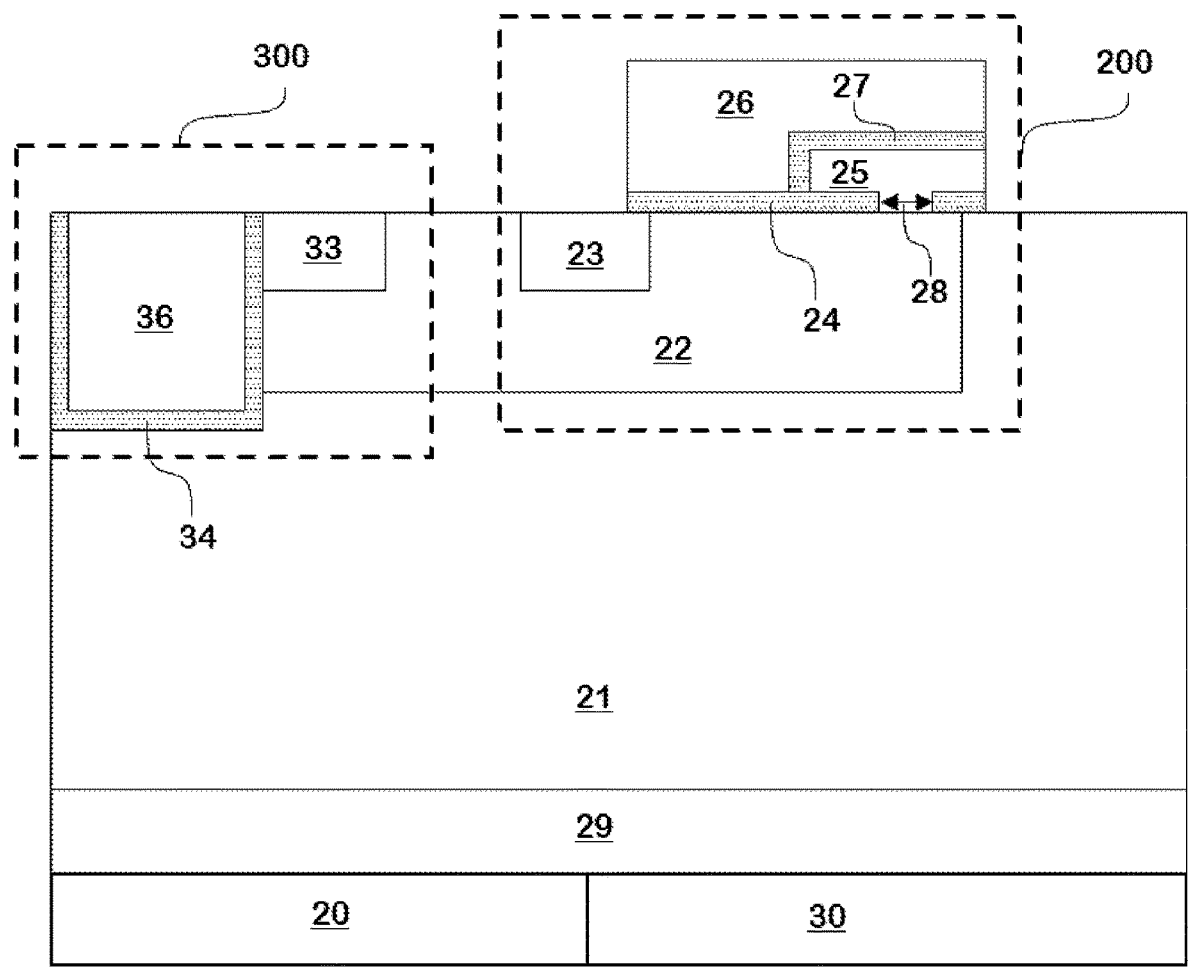
FIG. 2 is a sectional view of an IGBT device in a second embodiment provided by the present application.

FIG. 2 is a sectional view of an IGBT device in a second embodiment provided by the present application. Different from the structure of the IGBT device in the first embodiment of the present application shown in FIG. 1, in this embodiment, the first n-type emitter region 23 and the second n-type emitter region 33 are formed in a same p-type body region 22, and the second MOSFET cell 300 also includes a gate trench recessed in the n-type drift region 21, and the second gate dielectric layer 34 and the second gate 36 are both formed in the gate trench. The second MOSFET unit 300 using a vertical current channel structure may further reduce the size of the chip of the IGBT device.

Figure 3:
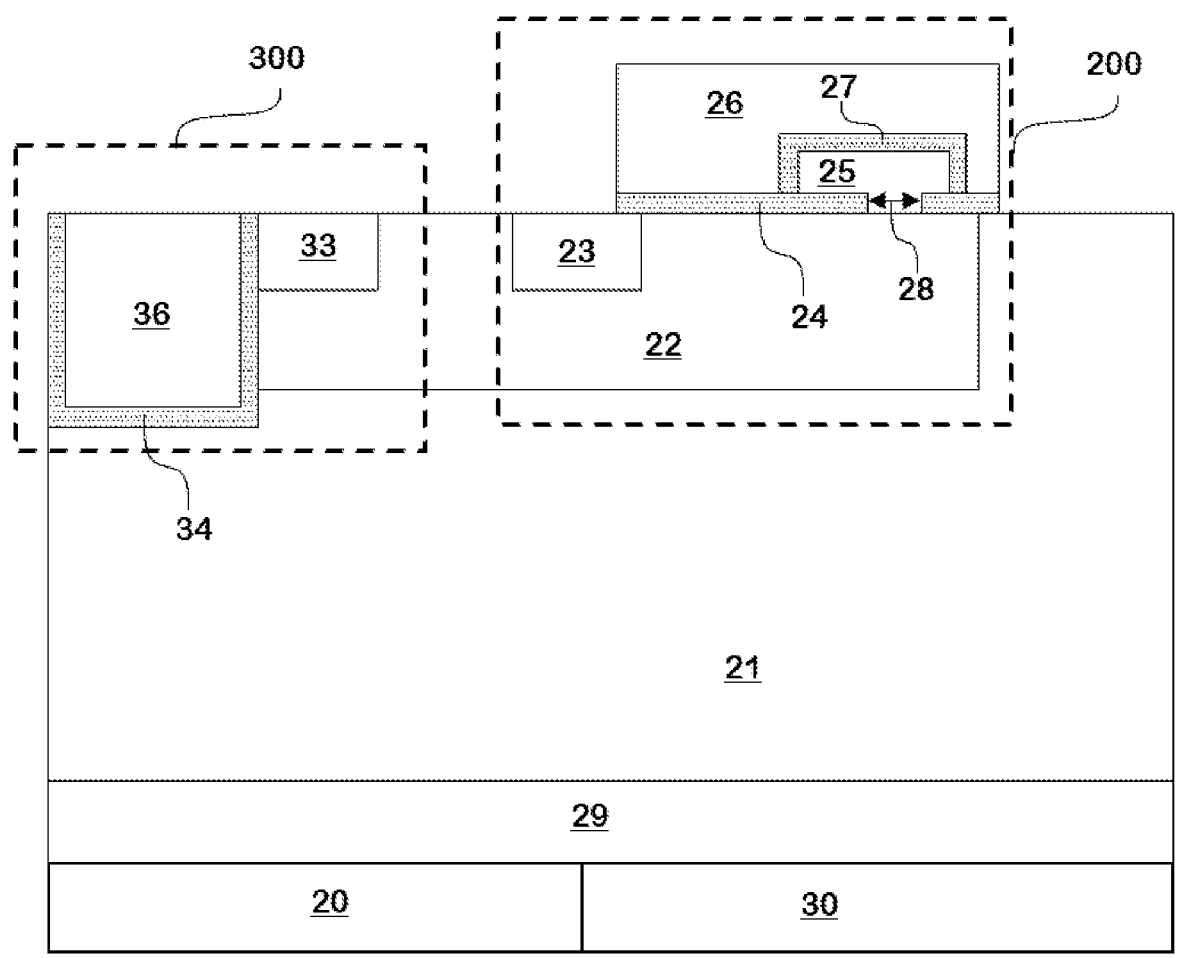
FIG. 3 is a sectional view of an IGBT device in a third embodiment provided by the present application.

FIG. 3 is a sectional view of an IGBT device in a third embodiment provided by the present application. Different from the structure of the IGBT device in the second embodiment of the present application shown in FIG. 2, in this embodiment, the first gate 26 of the first MOSFET cell 200 extends above the n-type floating gate 25 and covers a side wall of the n-type floating gate 25 close to the n-type drift region 21, which can further increase an area of the first gate 26 covering the n-type floating gate 25, and further increase a capacity coupling ratio of the first gate 26 to the n-type floating gate 26.

What is claimed is:
1. An insulated gate bipolar transistor (IGBT) device, comprising:
an n-type collector region and a p-type collector region,
an n-type drift region located above the n-type collector region and the p-type collector region, a plurality of p-type body regions located at a top of the n-type drift region, and at least one first MOSFET cell and at least one second MOSFET cell;

wherein each first MOSFET cell of the at least one first MOSFET cell comprises: a first n-type emitter region located within each p-type body region of the plurality of p-type body regions; a first gate structure located above the each p-type body region, wherein the first gate structure comprises a first gate dielectric layer, a first gate and an n-type floating gate both located above the first gate dielectric layer, wherein the n-type floating gate is located on a side close to the n-type drift region in a lateral direction and the first gate is located on a side close to the first n-type emitter region and extends over the n-type floating gate; an insulating dielectric layer located between the n-type floating gate and the first gate; and an opening located in the first gate dielectric layer, wherein the n-type floating gate is in contact with the each p-type body region through the opening to form a p-n junction diode; and wherein each second MOSFET cell of the at least one second MOSFET cell comprises a second n-type emitter region located within the each p-type body region and configured to control ON and OFF of a current channel located between the second n-type emitter region and the n-type drift region, wherein the second gate structure comprises a second gate dielectric layer and a second gate.

2. The IGBT device of claim 1, further comprising: an n-type field cut-off region located above the n-type collector region and the p-type collector region, wherein the n-type field cut-off region is located under the n-type drift region.

3. The IGBT device of claim 1, wherein the each second MOSFET cell further comprises a gate trench recessed in the n-type drift region, and the second gate dielectric layer and the second gate are located within the gate trench.

4. The IGBT device of claim 1, wherein the first n-type emitter region and the second n-type emitter region are located within a same p-type body region of the plurality of p-type body regions.

5. The IGBT device of claim 1, wherein the first n-type emitter region and the second n-type emitter region are located within two different p-type body regions of the plurality of p-type body regions.

6. The IGBT device of claim 1, wherein the first gate covers a side wall of the n-type floating gate close to the n-type drift region.

7. The IGBT device of claim 1, wherein in a case where the IGBT device comprises a plurality of second MOSFET cells, the second gate of at least one of the plurality of second MOSFET cells is electrically connected to the second n-type emitter region.

* * * * *